United States Patent [19]

Chitre

[11] 4,273,950
[45] Jun. 16, 1981

[54] SOLAR CELL AND FABRICATION THEREOF USING MICROWAVES

[75] Inventor: Sanjiv R. Chitre, Reseda, Calif.

[73] Assignee: Photowatt International, Inc., Tempe, Ariz.

[21] Appl. No.: 43,149

[22] Filed: May 29, 1979

[51] Int. Cl.³ .................. H01L 31/04; H01G 9/20; H01L 21/225

[52] U.S. Cl. .................. 136/255; 29/572; 34/4; 34/18; 136/256; 136/258; 136/261; 148/1.5; 148/174; 148/175; 148/188; 219/10.55 M; 219/10.55 R; 357/30; 357/59; 357/65; 427/45.1; 427/46

[58] Field of Search .................. 148/1.5, 174, 175, 188; 29/572; 136/89 TF, 89 CC, 255, 256, 258, 261; 427/45, 46; 219/10.55 M, 10.55 R; 34/4, 18; 357/30, 59, 65

[56] References Cited

U.S. PATENT DOCUMENTS

| | | | |
|---|---|---|---|
| 3,306,835 | 2/1967 | Magnus | 219/10.55 M |
| 3,351,503 | 11/1967 | Fotland | 148/188 |
| 3,502,516 | 3/1970 | Henker | 148/175 |
| 3,551,199 | 12/1970 | Forster | 427/45.1 |
| 3,914,856 | 10/1975 | Fang | 148/174 X |
| 3,990,097 | 11/1976 | Lindmayer | 357/30 |
| 4,086,102 | 4/1978 | King | 148/1.5 X |
| 4,104,091 | 8/1978 | Evans et al. | 148/188 |
| 4,147,563 | 4/1979 | Narayan et al. | 148/188 X |
| 4,152,535 | 5/1979 | Deminet et al. | 136/89 TF |
| 4,153,907 | 5/1979 | Kofron | 136/89 CC |
| 4,163,678 | 8/1979 | Frosch et al. | 136/89 CC |

FOREIGN PATENT DOCUMENTS 2840529  3/1979  Fed. Rep. of Germany ... 219/10.55 M

OTHER PUBLICATIONS

Kirkpatrick et al., "Silicon Solar Cells ... Processing", IEEE Trans. on Electron Devices, vol. ED-24, No. 4, Apr. 1977, pp. 429-432.

Runge, Dr. H., "Threshold Voltage ... Ion Implantation", Electronic Eng., Jan. 1976, pp. 41-43.

Brodsky, M. H., "Making Higher Efficiency Solar Cells ... -", IBM Tech. Discl. Bull., vol. 18, No. 2, Jul. 1975, pp. 582-583.

Joshi et al., "Masking Technique For Laser Induced Diffusion".

vol. 13, No. 4, Sep. 1970, p. 928.

von Gutfeld, R. J., "Crystallization of Silicon for Solar Cell Applications", I.B.M. Tech. Discl. Bull., vol. 19, No. 10, Mar. 1977, pp. 3955-3956.

*Primary Examiner*—L. Dewayne Rutledge
*Assistant Examiner*—W. G. Saba
*Attorney, Agent, or Firm*—Spensley, Horn, Jubas & Lubitz

[57] ABSTRACT

Solar cells are fabricated by spraying a dopant coating onto a semiconductor wafer and heating the surface of the wafer using unipolar microwaves. The resultant controlled heating drives dopant atoms from the coating into the wafer to produce a shallow junction at a selectable depth. Advantageously, metallic conductors are predeposited atop the dopant coating and then sintered to the semiconductor by the same unipolar microwave field concurrently with dopant drive-in. Efficient solar cells can be made with this process using polycrystalline silicon, since with unipolar microwave surface heating the grain boundaries do not become so deeply doped as to short circuit the junctions formed in the individual grains. Unipolar microwave heating also may be used to anneal ion implanted semiconductor devices.

8 Claims, 2 Drawing Figures

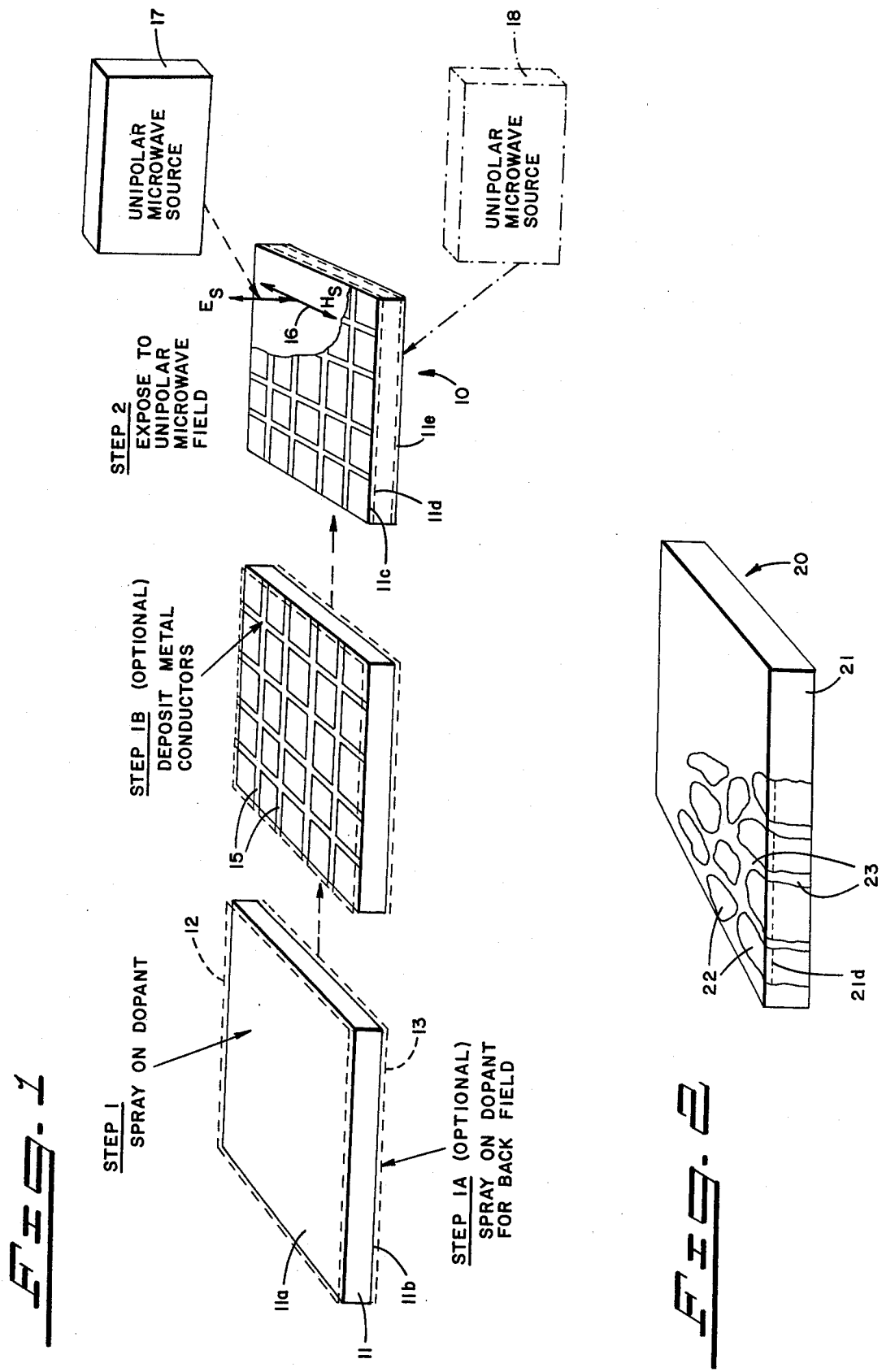

SOLAR CELL AND FABRICATION THEREOF USING MICROWAVES

BACKGROUND OF THE INVENTION

1. Field of the Invention

The present invention relates to solar cells and to a process for fabricating solar cells using unipolar microwave fields.

2. Description of the Prior Art

The utilization of solar energy as an alternative energy source has been limited by the lack of availability of efficient energy conversion mechanisms. Photovoltaic cells provide a means for directly converting solar energy to electricity. To make such solar cells economically advantageous, the "energy payback time" must be small. That is, the cumulative converted solar energy output from each cell must exceed, in a relatively short period of time, the amount of energy that was consumed in fabrication of the cell. One objective of the present invention is to provide a solar cell with relatively low energy payback time.

In the past, photovoltaic solar cells have been fabricated by using conventional diffusion techniques to form large area, shallow junctions in a single crystal semiconductor substrate. Typically, four inch diameter, semiconductor grade single crystal silicon wafers have been placed in a high temperature (1800° F.) infrared or resistance heating furnace and subjected to an atmosphere appropriate phosphrous, boron or other dopant atoms. Alternatively, a dopant material has been sprayed or spun onto the wafer, and the coated wafer then placed in the same type of oven to accomplish diffusion and drive-in of the dopant atoms into the substrate.

In either case, very large amounts of energy are used to fabricate the cell. The wafers typically remain in the diffusion furnace for one-half to one hour for each diffusion step. However, the furnace itself must remain on for a far longer time, typically many hours, so as to ensure temperature stability. Moreover, wafer heating may be repeated several times during the fabrication of a single solar cell. Thus separate diffusion steps may be used to form the shallow junction on the front surface of the semiconductor wafer, and to form the different conductivity type back surface field diffusion on the obverse side of the wafer. Yet a third high temperature furnace step is used to sinter the requisite metallic conductors to the wafer. Each resultant solar cell must be operated for a long time before the cumulative recovered solar energy exceeds the quite large amount of energy that was used (primarily in the diffusion and annealing furnace steps) to fabricate the solar cell.

In addition to the large energy payback time, other shortcomings are inherent in prior art solar cells. For example, the theoretical efficiency of the cells may not be reached because of adverse effects resulting from heating of the entire silicon substrate in the furnace. The thermal stress in the silicon can produce deep lying traps resulting in greater leakage and shorter bulk lifetime of the silicon. This may result in reduced photovoltaic efficiency, with a concomitant reduction in the conversion efficiency from solar to electrical energy.

Another shortcoming of this prior art technique is that it is impractical to compensate for variations from wafer to wafer. Usually, a number of wafers are placed in the furnace at the same time. Although subjected to the same temperature and atmosphere, differences often result in the diffusion depth, uniformity and/or dopant concentration. Individual correction is impractical. As a result, those devices not meeting specification must be eliminated, thereby reducing overall yield.

A further shortcoming of the prior art is that the solar cells must be fabricated of single crystal material. If a polycrystalline semiconductor is used, diffusion of dopant impurities into the gain boundaries converts these boundaries to conductors which short out the device junctions. Inoperative devices result.

Described differently, the polycrystalline semiconductor material can be visualized as containing multiple grains of single crystal silicon embedded in a matrix or separated by grain boundaries of non-single crystal silicon. When such a wafer is placed in a vapor diffusion furnace, the dopant atoms diffuse into each grain to a shallow depth, thereby forming the requisite junction. However, the same impurity atoms diffuse to a far greater depth, and to a greater concentration level within the grain boundaries. The boundaries thus become conductive, and either short out the junctions in the individual grains or act as a conduction path or sink to ground. When used as a solar cell, the photovoltaic current thus is shorted to ground and is not available as a useful output from the cell.

Another objective of the present invention is to provide a photovoltaic solar cell of high efficiency that may be fabricated from polycrystalline semiconductor material. Since such polycrystalline material generally is less expensive than a single crystal of like size, decreased cost results. Further, it may be possible to provide polycrystalline silicon wafers of significantly greater area than is possible with single crystal material.

Another objective of the present invention is to provide an improved metal annealing technique that is particularly useful for providing conductors on a solar cell. At present, the metal conductors are evaporated or electroless plated onto the face of the solar cell after junction formation. The cell is placed in a conventional infrared or resistance furnace to sinter the metal to the silicon. This increases power consumption during device fabrication, and may result in further degradation of the bulk lifetime. In addition, a separate furnace may be required for this purpose thereby increasing capital equipment requirements and the amount of floor space necessary for the production facilities. An object of the present invention is to eliminate such requirements by utilizing unipolar microwave energy to accomplish annealing or sintering of the metallic conductors. Advantageously, this is accomplished simultaneously with drive-in of the junction forming dopant atoms.

Still a further object of the present invention is to provide a technique for the annealing of ion implanted structures using microwaves.

SUMMARY OF THE INVENTION

These and other objectives are achieved by providing solar cell fabrication techniques using uniplanar microwave fields for dopant atom drive-in, metal conductor sintering and other purposes. Low power consumption and minimal floor space and equipment requirements result. Solar cells produced in accordance with the present invention have a quite short energy payback time. Low cell cost is possible, particularly since efficient solar cells can be fabricated of polycrystalline semiconductor material.

In a typical embodiment, a solar cell is fabricated by initially spraying onto a surface of a single crystal or polycrystalline silicon wafer a coating of a dopant material. Next, an array of metal conductors is deposited atop the dopant using evaporation or electroless plating techniques. Optionally, a different dopant material may be sprayed onto the obverse side of the wafer for back surface field formation.

The wafer then is exposed to unipolar microwave energy, advantageously oriented so that the magnetic field component is parallel to the wafer surface and the electric field component is perpendicular to this surface. The unipolar microwaves produce heating of the wafer surface to a controllable, shallow depth. Dopant atoms thus are driven into the semiconductor substrate to form a large area shallow junction of controlled depth. Concurrently, the unipolar microwave heating sinters the metallic conductors to the semiconductor, thereby accomplishing ohmic contact formation. The difference in dielectric coefficient of the metal and semiconductor effectively ensures that the metal conductors will be sintered to the surface-adjacent layer of the substrate, and will not short out or interfere with the shallow junction that is concurrently formed. The obverse surface of the wafer may concurrently be exposed to a second unipolar microwave source which drives in the dopant atoms to form the back surface field. In a typical embodiment, the bulk semiconductor may be N type silicon, with phosphorous used as the N+ type dopant to form the shallow junction and boron used to form a P+ back field region on the device obverse side.

Advantageously, such solar cells may be fabricated of polycrystalline semiconductor. Because of the significant difference in dielectric coefficient between the single crystal grains and the grain boundaries, the unipolar microwave field causes little or no heating of the grain boundaries. Thus, while the single crystal grains are heated sufficiently to achieve dopant drive-in and junction formation, very little dopant drive-in and conductivity conversion of the grain boundaries occurs. As a result, unlike the prior art, the grain boundaries do not become conductive and do not short out or act as a current sink for the shallow junctions formed in the individual grains. This permits the device, when provided with an appropriate network of ohmic conductors, to be used as a solar cell. As described above, the unipolar microwave heating also accomplishes sintering of these conductors.

A unipolar microwave field also may be used for controlled annealing of ion-implanted structures. Thus, ions implanted into interstitial positions in a surface-adjacent region of a semiconductor body may be converted to substitutional positions within the semiconductor lattice by controlled exposure and heating of the semiconductor surface using unipolar microwaves.

BRIEF DESCRIPTION OF THE DRAWINGS

A detailed description of the invention will be made with reference to the following drawings wherein:

FIG. 1 diagrammatically illustrates the inventive process for forming solar cells or like semiconductor devices using unipolar microwaves; and FIG. 2 is an enlarged fragmentary view of a solar cell fabricated in accordance with the present invention of a polycrystalline material.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention best is defined by the appended claims.

Operational characteristics attributed to forms of the invention first described also shall be attributed to forms later described, unless such characteristics obviously are inapplicable or unless specific exception is made.

Referring to FIG. 1, a solar cell 10 may be fabricated of single crystal silicon. For example, the wafer or substrate 11 may comprise as cut silicon having a resistivity of between 0.5 and 10 ohm-centimeters. The crystal orientation is not critical, and may for example be 110 or 111.

The wafer front face 11a initially is coated with a conventional spray-on dopant 12. For example, if the wafer 11 is N type silicon, a phosphoroous or phosphorosilica coating in a water base may be sprayed onto the wafer face 11a. The coating 12 may be very thin, typically about 2 microns. In an automated system this may be accomplished by using a nozzle which reciprocates transversely across the wafer face 11a as the wafer 11 is transported past the nozzle on a conveyor.

As an optional step 1A, which may be accomplished simultaneously or sequentially with the spray-on of the dopant 12, a different dopant layer 13 may be sprayed onto the obverse face 11b of the wafer 11. For example, a borosilica or other metal borate dopant in an alcohol or other volatile solvent solution may be sprayed onto the face 11b for ultimate production of a P+ back surface field.

Although not shown in FIG. 1, the wafer 11 containing the coatings 12 and 13 may be placed in an infrared or other oven for the purpose of evaporating the wafer or volatile solvents from these coatings. The relatively low elevated temperature required to evaporate such solvents is considerably lower than that at which adverse bulk lifetime effects would occur in the silicon substrate 11.

As an optional next step 1B, an array of metal conductors 15 may be provided atop the coated wafer surface 11a using conventional evaporation or electroless plating techniques. Typically, the conductor array may cover between about eight to ten percent of the area of the upper face 11a. This is a compromise between the objectives of maximizing the junction area that is exposed to light (which requires minimum conductor area) while at the same time maximizing the current collecting capability of the array 15 (which is aided by increased conductor area). Typically, the metal conductors may be 100 mils wide and 2 microns thick.

Next the wafer 11 is subjected to a unipolar microwave field (represented by the arrows 16 in FIG. 1) from a microwave source 17. It has been found that preferred results are obtained when the magnetic field component Hs is oriented parallel to the wafer face 11a, and the electric field component Es is perpendicular to the face 11a. The effect of this unipolar microwave field 16 is to cause localized heating of the wafer surface 11a so as to promote drive-in of dopant atoms from the coating 12 to a controlled depth within the substrate 11, and concurrently to cause sintering of the metal conductors 15 to the semiconductor wafer. The dopant drive-in converts a surface-adjacent region 11c of the wafer 11 to N+ type conductivity and produces a large area, shallow junction 11d at a controllable depth.

The microwave heating step 2 advantageously is carried out using a magnetron or other microwave source 17 situated so as to produce the requisite unipolar microwave field. For example, the generated field may have a TEM 001 or TEM 100 mode. Unlike conventional microwave ovens for cooking foods, no mode stirrer is used. The objective is to obtain a unipolar microwave field which effectively heats only the face 11a of the wafer 11 being processed.

Advantageously, but not necessarily, the microwave source may be pulsed, both so as to reduce the average power and to aid in the controlled heating of the semiconductor surface. By way of example only, the microwave source may have a typical frequency of 2450 MHz and a 50% duty cycle, with on-time 5 nsec and an off-time of 5 nsec. The particular frequency, duty cycle and on/off time durations may be determined empirically to obtain a particular dopant concentration and junction depth.

Generally, the dielectric constant of the dopant layer 12 will be considerably lower than that of the semiconductor substrate 11. As a result, the coating 12 will be substantially "transparent" to microwaves. The effect will be that the microwaves primarily heat only the surface 11a of the wafer 11.

Furthermore, the effective dielectric constant of the silicon itself changes as heat is applied. Thus when the initial microwave pulse impinges on the wafer 11, only a very thin top surface layer is heated. The dielectric constant of this layer changes. Thus when the next microwave pulse impinges on the wafer 11 it primarily heats the next semiconductor layer immediately subjacent to the top layer. During consecutive microwave pulses, progressively deeper layers of the silicon are heated. Control of the duty cycle, on and off times, frequency and peak power of the microwave source thus permits controllable, incremental heating of the wafer 11 in very fine, progressively deeper steps.

This progressively deeper heating of the wafer 11 results in very fine control of the depth of penetration and concentration of the dopant atoms from the coating 12. A wide area shallow junction of uniform and controllable depth and dopant concentration is produced. Moreover, thermal gradients in the wafer 11 are minimized, and little or no heating of the bulk silicon takes place. Thus the adverse bulk lifetime reduction effect of prior art diffusion furnace heating is eliminated. Moreover, there is little or no surface damage done to the wafer 11, in contradistinction to prior art vapor diffusion techniques in which surface damage by gas molecules often reduced photovoltaic efficiency. Thus by using the present technique of unipolar microwave surface heating to accomplish junction formation, higher efficiency solar cells are produced.

The technique just described, consisting of (a) spray-on of a dopant coating, and (b) unipolar microwave heating to drive dopant atoms into a surface-adjacent layer of the semiconductor substrate, may be used by itself to form a shallow junction, or in conjunction with the optional step 1B (FIG. 1) simultaneously to anneal or sinter ohmic conductors to the junction thus formed. The latter technique takes advantage of the fact that dopant atoms from the coating 12 penetrate faster into silicon than does a metal. Thus the effect of the incident unipolar microwave field is to cause the dopant atoms to form the junction 11b as described above, while simultaneously causing a very slight penetration of the metal from the conductors 15 into the silicon. The resultant sintering occurs very close to the surface 11a of the silicon, at a depth significantly less than that of the simultaneously formed junction 11d. Good electrical contact is made between the conductors 15 and the doped region 11c, with no shorting of the junction 11d.

A second like unipolar microwave source 18 may be used to heat the lower surface 11b of the wafer 11 so as to drive dopant atoms from the coating 13 into the back side of the wafer 11. This forms the back surface field 11e which typically is of P+ conductivity. The result is a solar cell manufactured by a simple process, illustrated in FIG. 1, which requires little energy, may be totally automated, and which needs considerably less space for manufacture than does an arrangement using prior art fabrication techniques.

The same process advantageously may be used to manufacture solar cells of polycrystalline semiconductor material, as illustrated in FIG. 2. There, the device 20 consists of a wafer 21 of polycrystalline silicon in which individual grains 22 (shown not to scale) are separated by grain boundaries 23. The grain boundaries 23, which may be thought of as imperfections in the overall crystalline structure, have a significantly lower dielectric constant from that of the single crystal grains 22 of silicon. As a result, when exposed to a unipolar microwave field the depth of microwave penetration, and concomitantly the depth of heating is less in the boundaries 23 than in the grains 22.

When the solar cell fabrication process of FIG. 1 is carried out using a polycrystalline wafer 20, dopant atoms are driven into the grains 22 to form a requisite shallow junction 21d within the individual grains. While dopant atoms also penetrate slightly into the grain boundaries 23, the resultant doping is insufficient both in depth and concentration to convert these boundaries to conductors. This eliminates the problem in the prior art in which, if a polycrystalline wafer were exposed in a vapor diffusion furnace, the grain boundaries would become so heavily doped as to be conductive and to short out the junctions formed in the grains 22. Thus were the prior art process could not be used to produce operative, efficient solar cells from polycrystalline material, the present invention does enable such fabrication. The resultant polycrystalline solar cells may be of less cost or larger in size than those fabricated of single crystal semiconductors.

Another application of the controllable surface heating effects obtained using unipolar microwaves is the annealing of ion-implanted structures. In the fabrication of certain semiconductor devices, ions are implanted into surface-adjacent regions of a semiconductor. Using conventional ion bombardment equipment, these ions normally are implanted in interstitial positions. Annealing is necessary to change these atoms from interstitial to substitutional positions, so as to make them electrically active.

In the past, this has been done by either heating in a conventional infrared or resistance furnace, or by laser scanning. Both methods require very large amounts of power. However, it has been found that such annealing can be accomplished very efficiently by controlled surface heating of the ion bombardment semiconductor surface using unipolar microwaves having the orientation described above, with the magnetic field component parallel to the semiconductor surface and the electric field component perpendicular thereto. By appropriate control of the parameters of power, duty cycle, frequency and on/off time, controlled annealing can be accomplished with relatively low energy consumption and without adverse effects to the bulk lifetime of the semiconductor.

I claim:

1. A process for making solar cells or like junction devices comprising:
   providing a dopant adjacent the surface of a polycrystalline silicon semiconductor substrate, and
   exposing said dopant and substrate to a unipolar microwave field so as to drive atoms from said dopant into said substrate to a selected depth, while controlling one or more of the microwave field parameters of frequency, power, duty cycle and on/off time so as to obtain said selected depth, and wherein:
   said parameters are selected so that said dopant atoms are driven into grains of said substrate to a depth sufficient to form a shallow junction therein, concurrent drive-in of dopant atoms into grain boundaries of said substrate being insufficient to convert said boundaries to conductive short circuits for said shallow junction, the dopant level of said grain boundaries being lower than that of said grains.

2. A solar cell or like junction drive formed by the process of claim 1.

3. A process for making solar cells or like junction devices comprising:
   providing a dopant adjacent the surface of a semiconductor substrate,
   exposing said dopant and substrate to a unipolar microwave field so as to drive atoms from said dopant into said substrate to a selected depth, and
   disposing one or more metal conductors on said substrate atop said dopant, said step of exposing including simultaneously or sequentially also exposing said metal conductors to said unipolar microwave field so as to sinter said metal conductors to said substrate to form electrical connection to the portion of said substrate into which said dopant atoms are driven.

4. A process for making a solar cell, comprising:
   spraying a dopant coating onto one surface of a semiconductor substrate,
   depositing at least one metallic conductor atop said dopant coating, and
   exposing said dopant coating, said conductor and said semiconductor one surface to a unipolar microwave field, said field driving dopant atoms from said coating into said substrate so as to form a shallow junction while concurrently sintering said metallic conductor to said substrate thereby to provide an electrical connection to said junction.

5. A process for making solar cells or like junction devices comprising:
   providing a dopant adjacent the surface of a semiconductor substrate,
   exposing said dopant and said substrate to a pulsed unipolar microwave field so as to incrementally heat progressively deeper layers of said substrate, the initial microwave pulse primarily heating and hence changing the dielectric constant of only a thin top surface layer of said substrate, subsequent unipolar microwave pulses then progressively heating and changing the dielectric constant of incremental, sequentially progressively deeper layers of said substrate, atoms from said dopant being driven by said pulsed unipolar microwave heating into said progressively deeper heated layers of said substrate,
   said exposing step being carried out with the magnetic field component of said unipolar microwave field oriented parallel to the surface of said substrate and the electric field component of said microwave field oriented perpendicular to said substrate, and
   controlling the unipolar microwave field parameters of frequency, power, pulse duty cycle and on/off time so as to obtain incremental layer heating and concomitant dopant depth of penetration and concentration in fine, progressively deeper steps.

6. A process according to claim 1 wherein said dopant is sprayed onto said semiconductor substrate surface.

7. A process according to claim 1 further comprising:
   providing a second dopant adjacent the obverse surface of said semiconductor substrate, and
   also exposing said second dopant to a unipolar microwave field so as to drive atoms from said second dopant into said substrate from said obverse surface to a second selected depth.

8. A solar cell comprising:
   a polycrystalline silicon substrate,
   a shallow junction formed in a substantial percentage of the individual single crystal silicon grains of said substrate, the grain boundaries in said substrate being doped to a level that is lower than that of the single crystal grains dopant level and insufficient to short circuit said junctions, and
   electrical conductors on a portion of the surface of said substrate, said conductors being sintered to a surface adjacent portion of said substrate and providing electrical contact to said junctions,
   said shallow junctions being formed by coating said substrate with a dopant and driving atoms of said dopant into said substrate using a unipolar microwave field, the dielectric constant of said grain boundaries being sufficiently different from that of said silicon grains so that said field will cause sufficient drive-in of said atoms into said grains to produce a shallow junction therein while said field will cause insufficient heating of said grain boundaries to cause substantial doping thereof by said atoms, said field concurrently sintering said conductors to said surface adjacent portion.

* * * * *